US008433958B2

(12) United States Patent
Ding et al.

(10) Patent No.: US 8,433,958 B2
(45) Date of Patent: Apr. 30, 2013

(54) BIT ERROR RATE CHECKER RECEIVING SERIAL DATA SIGNAL FROM AN EYE VIEWER

(75) Inventors: Weiqi Ding, Fremont, CA (US); Mingde Pan, Morgan Hill, CA (US); Peng Li, Palo Alto, CA (US); Sergey Shumarayev, Los Altos Hills, CA (US); Masashi Shimanouchi, San Jose, CA (US)

(73) Assignee: Altera Corporation, San Jose, CA (US)

( * ) Notice: Subject to any disclaimer, the term of this patent is extended or adjusted under 35 U.S.C. 154(b) by 286 days.

(21) Appl. No.: 12/884,923

(22) Filed: Sep. 17, 2010

(65) Prior Publication Data

US 2012/0072785 A1    Mar. 22, 2012

(51) Int. Cl.
 *G06F 11/00* (2006.01)
(52) U.S. Cl.
 USPC .............................. 714/704; 714/709; 714/703
(58) Field of Classification Search .................. 714/704, 714/709, 701, 703
 See application file for complete search history.

(56) References Cited

U.S. PATENT DOCUMENTS

| 7,373,561 B2 | 5/2008 | Baumer et al. |
| 7,539,242 B2* | 5/2009 | Yoshioka ...................... 375/219 |
| 7,743,288 B1* | 6/2010 | Wang ............................. 714/704 |
| 2007/0156360 A1 | 7/2007 | Romero |
| 2008/0133958 A1 | 6/2008 | Cranford et al. |
| 2009/0077541 A1* | 3/2009 | Jeffries et al. .................. 717/127 |
| 2011/0221477 A1* | 9/2011 | Ding et al. ....................... 327/65 |

OTHER PUBLICATIONS

U.S. Appl. No. 12/082,343, filed Apr. 9, 2008, Ding et al.
U.S. Appl. No. 12/082,483, filed Apr. 11, 2008, Ding et al.
U.S. Appl. No. 12/630,674, filed Dec. 3, 2008, Ding et al.
International Search Report and Written Opinion issued in corresponding Application No. PCT/US2011/052028 dated Apr. 13, 2012.
U.S. Appl. No. 12/762,848, filed Apr. 9, 2010, Li et al.
U.S. Appl. No. 12/884,305, filed Sep. 17, 2010, Li, Peng.
U.S. Appl. No. 12/884,747, filed Sep. 17, 2010, Ding et al.

* cited by examiner

*Primary Examiner* — Fritz Alphonse
(74) *Attorney, Agent, or Firm* — Mauriel Kapouytian & Treffert LLP; Ararat Kapouytian

(57) ABSTRACT

An IC that includes an eye viewer and a BER checker coupled to the eye viewer, where the BER checker receives a serial data signal from the eye viewer, is provided. In one implementation, the BER checker receives the serial data signal from the eye viewer without the serial data signal passing through a deserializer. In one implementation, the BER checker compares the serial data signal against a reference data signal to determine the BER for the serial data signal. In one implementation, the IC includes an IC core coupled to the eye viewer and the BER checker, where the BER checker is outside the IC core. In one implementation, the BER checker is a dedicated BER checker. In one implementation, the BER checker includes an exclusive OR gate, a programmable delay circuit coupled to the exclusive OR gate, and an error counter coupled to the exclusive OR gate.

20 Claims, 3 Drawing Sheets

BIT ERROR RATE CHECKER RECEIVING SERIAL DATA SIGNAL FROM AN EYE VIEWER

BACKGROUND

The present invention relates to bit error rate (BER) checkers.

The eye viewer in a receiver has an ability to observe the eye diagram of a receiver (RX) equalization output. Such an eye viewer, for example, may be used in a high speed serial interface (HSSI) receiver. A receiver of an integrated circuit (IC) is generally integrated with the IC. Similarly, the eye viewer in the receiver is also integrated with the IC. Such an eye viewer is referred to as an on-die or on-chip eye viewer. The eye viewer in the receiver provides several benefits. First, the on-chip eye monitor can work like a scope to probe the internal high-speed nodes which cannot be observed by probing external pins. Second, the eye diagram output by the eye-viewer shows the RX equalization results. This allows for adjusting the amount of equalization to achieve the desired eye diagram. Additionally, the on-chip eye monitor enables one to diagnose and debug HSSI devices without probes and oscilloscopes in field.

The BER checker monitors for data errors of sampled data received from the eye viewer. The BER checker may check for cyclic redundancy check (CRC) errors for unknown data patterns or it may check BER for known data patterns. This may be done to test or debug a device. It may also be used with idle or training sequences, such as "K" or "D" data packages or combinations thereof.

However, in some devices, e.g., in the Stratix® IV GX or GT devices available from Altera® Corporation of San Jose, Calif., in order to perform BER checking on the data output by the eye viewer, the data from the eye viewer is sent to the device core via the deserializer. In these devices, soft intellectual property (IP) in the device core is used to determine the BER. A contour (or multiple contours) of the data eye can be generated based on a threshold BER (or multiple BERs). As a result of sending the data from the eye viewer to the device core via the deserializer for BER checking, BER checking and the clock data recovery (CDR) circuitry share the deserializer. This prevents the use of the eye viewer for BER checking without interrupting the normal operating RX data path. Furthermore, only one out of two data sets can be fed to the soft IP BER checker.

Embodiments of the present invention arise in this context.

SUMMARY

In one aspect, an embodiment of the present invention provides an IC including an eye viewer and a BER checker coupled to the eye viewer, where the BER checker receives a serial data signal from the eye viewer. In one embodiment, the BER checker receives the serial data signal from the eye viewer without the serial data signal passing through a deserializer. Also, in one embodiment, the BER checker compares the serial data signal against a reference data signal to determine a BER for the serial data signal.

In one embodiment, the IC includes an IC core coupled to the eye viewer and the BER checker, where the BER checker is outside the IC core. In one embodiment, the BER checker is a dedicated BER checker. In one embodiment, the BER checker includes an exclusive OR gate, a programmable delay circuit coupled to the exclusive OR gate, and an error counter coupled to the exclusive OR gate.

Embodiments of the IC of the present invention allow for BER checking the data signal output by the eye viewer while bypassing the deserializer. As a result, the deserializer need not be shared between the data signal output by the CDR and the data signal output by the eye viewer. As such, the BER checker can be used to determine the BER of the data signal output by the eye viewer without impacting the normal data link between the CDR and the deserializer.

Also, as in one embodiment, the BER checker is outside the IC core, there is no need to implement a soft IP BER in the IC core. This allows for saving IC costs in the IC core.

Furthermore, embodiments of the BER checker of the present invention provide support for any RX data patterns.

BRIEF DESCRIPTION OF THE DRAWINGS

The novel features of the invention are set forth in the appended claims. However, for purpose of explanation, several aspects of particular embodiments of the invention are described by reference to the following figures.

DETAILED DESCRIPTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
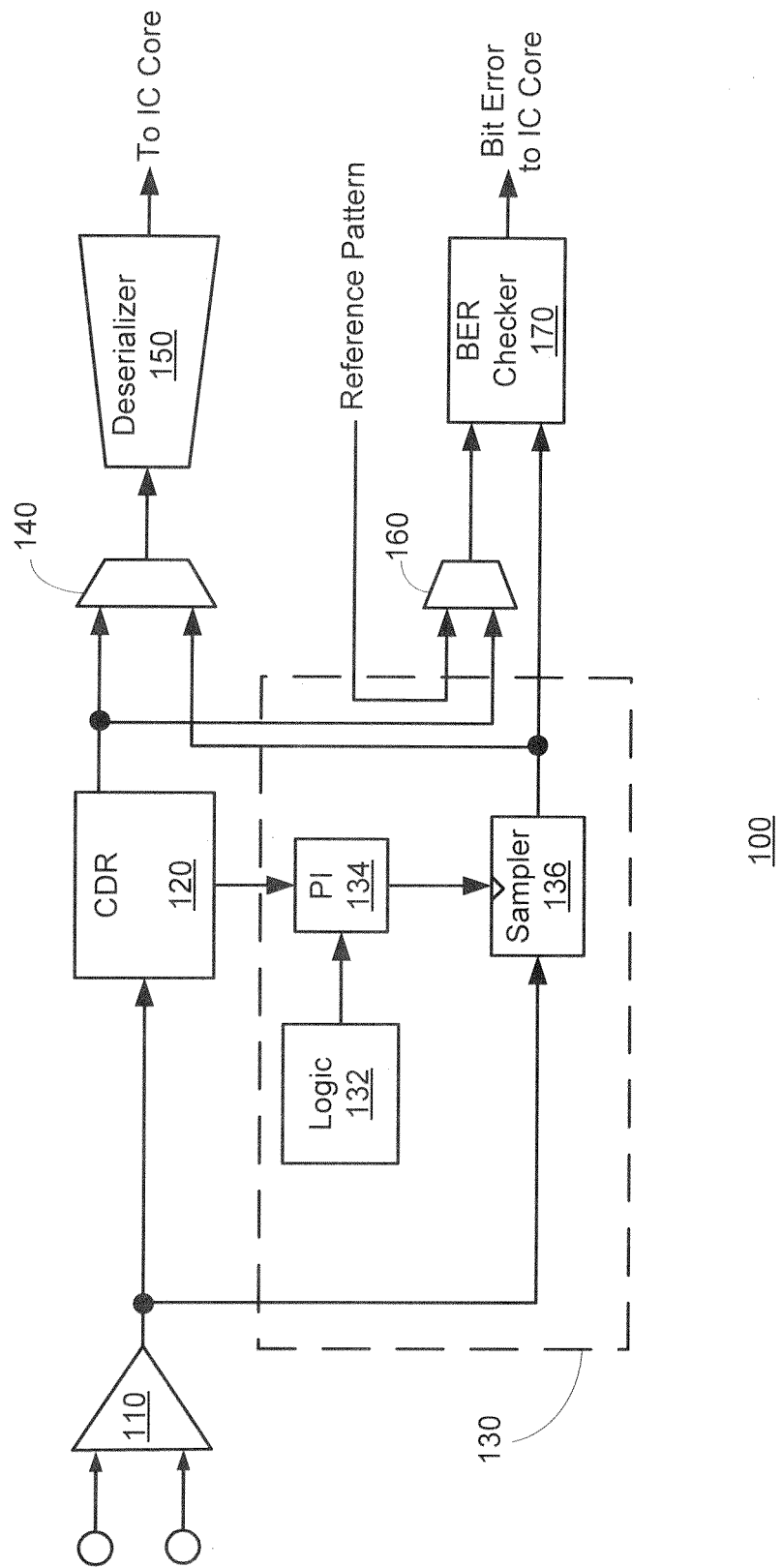
FIG. 1 is a block diagram of one embodiment of the receiver circuitry and BER checker of the present invention.

FIG. 1 is a block diagram of one embodiment of the RX circuitry and BER checker of the present invention. In FIG. 1, RX circuitry and BER checker 100 includes RX equalizer 110, CDR circuitry 120, eye viewer 130, multiplexer 140, deserializer 150, multiplexer 160, and BER checker 170. It is to be noted that BER checker 170 may be considered to be part of the RX circuitry. In other words, RX circuitry and BER checker 100 may simply be referred to as RX circuitry 100, which includes BER checker 170. In one embodiment, RX circuitry and BER checker 100 is included in an IC with which it is integrated. In one embodiment, the IC is a programmable logic device (PLD).

Eye viewer 130 includes logic circuit 132, phase interpolator (PI) 134, and sampler 136. PI 134 is coupled to CDR circuitry 120, logic circuit 132 and sampler 136. Logic circuit 132 is coupled to PI 134. Sampler 136 is coupled to PI 134, RX equalizer 110, multiplexer 140, and BER checker 170. PI 134 receives a clock signal from CDR 120 and phase shifts the clock signal away from the center of the data bit. The phase shift amount is determined by the control signal PI 134 receives from logic circuit 132. In one embodiment, logic circuit 132 is a state machine that receives control signals from the IC core e.g., the PLD core) and provides control signals in response thereto. PI 134 provides the phase shifted clock signal to sampler 136, which also receives data signals from RX equalizer 110. Sampler 136 samples data signals using the phase shifted clock signal it receives from PI 134 and provides the sampled data signal to BER checker 170 and multiplexer 140. In one embodiment, eye viewer 130 is similar to those used in the Stratix® IV GX or GT devices available from Altera® Corporation of San Jose, Calif.

In addition to the sampled data signal from eye viewer 130 (more specifically, sampler 136 of eye viewer 130), multiplexer 140 also receives the data signal output by CDR circuitry 120. Multiplexer 140 selects one of its input signals and provides the selected signal to deserializer 150. Deserializer 150 receives serial data, converts it to parallel data, and provides the parallel data to the IC core.

In addition to the sampled data signal from eye viewer 130 (more specifically, sampler 136 of eye viewer 130), BER checker 170 also receives a reference data signal. BER checker 170 receives the reference data signal from multiplexer 160. BER checker 170 compares the data signal received from eye viewer 130 against the reference data signal and provides a BER based on that comparison.

The reference data signal may be a known data signal or a recovered data signal from CDR circuitry 120. The known data signal may, for example, be prestored in the memory of the IC, be generated by on-die pattern generators such as a pseudo-random binary sequence (PRBS) generator, or be externally provided. The recovered data signal from CDR circuitry 120 is a blind recovered data signal as that data signal is not necessarily known beforehand. Use of the recovered data signal from CDR circuitry 120 is convenient in that the recovered data signal can be any data pattern in mission mode. It is to be noted that, when using the recovered data signal from the CDR circuitry as the reference data signal, the accuracy of BER checker 170 depends on the accuracy of the recovered data signal. Thus, in one embodiment, the upper limit of the BER output by the BER checker is the BER of the CDR circuitry.

Multiplexer 160 receives a known data signal and the recovered data signal from CDR circuitry 120. Multiplexer 160 selects one of these two data signals and provides the selected signal as the reference data signal to BER checker 170.

In one embodiment, such as that shown in FIG. 1, BER checker 170 is outside the IC core. Also, BER checker 170 receives a data signal from eye viewer 130 for BER checking without that data signal passing through deserializer 150. In other words, the data signal from eye viewer 130 need not share deserializer 150 with the data signal output by CDR circuitry 120. This allows for the data link from CDR circuitry 120 to the deserializer 150 to be maintained while BER checker 170 checks the BER of the sampled data signal it receives from eye viewer 130.

Furthermore, in one embodiment, BER checker 170 is a dedicated BER checker. In other words, it is a hard BER checker is a non-configurable BER checker). Also, in one embodiment, the data signal BER checker 170 receives from eye viewer 130 is a serial data signal, rather than a parallel data signal.

In addition to BER checking using BER checker 170, an embodiment of the present invention, also allows for performing BER checking on the data signal from eye viewer 130 using soft IP in the IC core. In such a case, multiplexer 140 would select the data signal from eye viewer 130 for providing to deserializer 150.

As can be observed from FIG. 1, the data signal output by eye viewer 130 is sent to both BER checker 170 and multiplexer 140. When multiplexer 140 selects the data signal it receives from eye viewer 130, that data signal is provided to deserializer 150. Thus, reference herein to the fact that BER checker 170 receives the data signal from eye viewer 130 without that data signal passing through deserializer 150 is directed to the actual data signal received by BER checker 170 from eye viewer 130, and not to the identical data signal (at least in terms of its data pattern that deserializer 150 may receive from eye viewer 130 via multiplexer 140.

Figure 2:
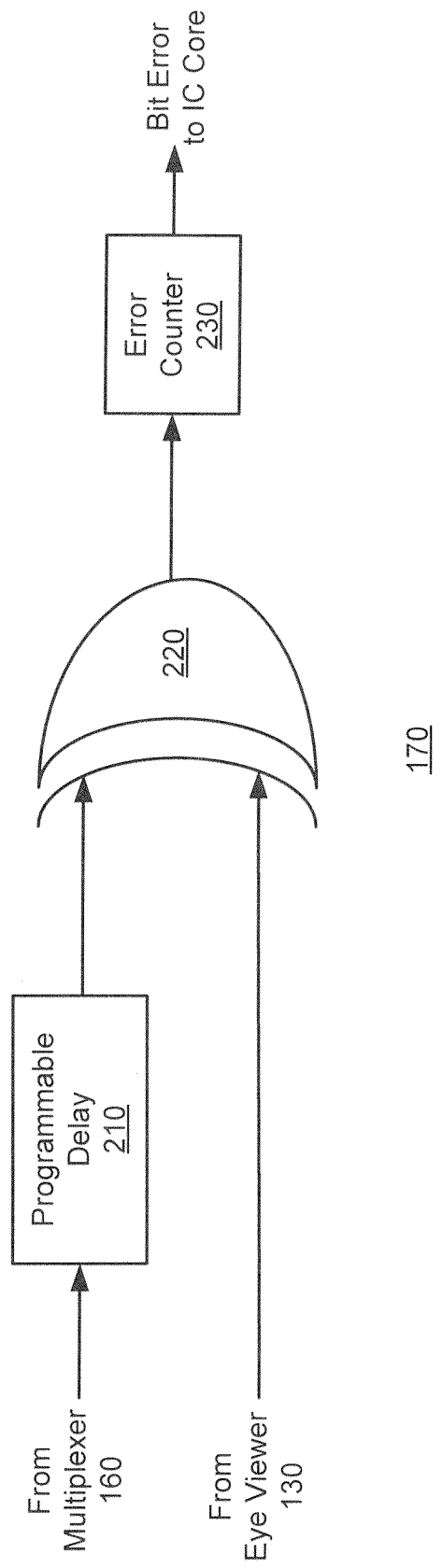
FIG. 2 is a detailed diagram of one embodiment of the BER checker shown in FIG. 1.

FIG. 2 is a detailed diagram of one embodiment of the BER checker 170 shown in FIG. 1. In FIG. 2, BER checker 170 includes programmable delay circuit 210, exclusive OR gate 220, and error counter 230.

Programmable delay circuit 210 is coupled to multiplexer 160 (shown in FIG. 1) and a first input terminal of exclusive OR gate 220. Programmable delay circuit 210 receives the reference data signal output by multiplexer 160, delays the reference data signal and provides the delayed reference data signal to the first input terminal of exclusive OR gate 220. In one embodiment, programmable delay circuit 210 includes a delay chain that includes inverters coupled in series. In another embodiment, programmable delay circuit 210 includes a delay chain that includes buffers coupled in series. In one embodiment, programmable delay circuit 210 receives a control signal from a logic circuit which controls the delay provided by programmable delay circuit 210. This logic circuit may be outside or inside the IC core. Programmable delay circuit 210 delays its input reference data signal such that it is in phase with the sampled data signal output by eye viewer 130 (shown in FIG. 1) and received by the second input terminal of exclusive OR gate 220. In other words, programmable delay circuit 210 aligns the reference data signal with the sampled data signal output by eye viewer 130 (i.e., it matches the delays of the reference data signal and the sampled data signal output by eye viewer 130.)

In one embodiment, the delay between the two input signals to exclusive OR gate 220 includes the delay due to the signal path difference of the two input signals and the delay introduced by PI 134. Programmable delay circuit 210 provides a delay that matches these delays. The delay due to the difference between the signal paths is fixed once the design for the circuit is fixed. This fixed delay may be accounted for by introducing a matching fixed delay by programmable delay circuit 210. On the other hand, the delay introduced by PI 134 varies and depends on the control signal PI 134 receives form logic circuit 132. As logic circuit 132 controls the delay introduced by PI 134, in one embodiment, a control signal from logic circuit 132 may also control the variable delay component introduced by programmable delay circuit 210 to match the delay introduced by PI 134.

In another embodiment, a programmable delay circuit may be on the data path from eye viewer 130 to exclusive OR gate 220, instead of on the data path from multiplexer 160 to exclusive OR gate 220, as shown in FIG. 2. In such an embodiment, the programmable delay circuit would, like programmable delay circuit 210, align the data signals that exclusive OR gate 220 receives on its two input terminals. In yet another embodiment, there may be a programmable delay circuit on each of the data paths to exclusive OR gate 220. Such programmable delay circuits again would align the data signals that exclusive OR gate 220 receives on its two input terminals.

Thus, exclusive OR gate 220, which is coupled to programmable delay circuit 210 and eye viewer 130, receives a data signal from eye viewer 130 and a reference data signal from programmable delay circuit 210 that is aligned with the data signal received from eye viewer 130. In one embodiment, BER checker 170 (and more specifically exclusive OR gate 220) receives and compares high speed serial data signals for BER checking. More specifically, in one embodiment, exclusive OR gate 220 is a high speed comparator. In another embodiment, a comparator other than an exclusive OR gate may be used to compare the data signal output by the eye viewer against a reference data signal.

Exclusive OR gate 220 is also coupled to error counter 230. Exclusive OR gate 220 compares the data signal received from eye viewer 130 against the reference data signal received from programmable delay circuit 210 and provides the result of that comparison to error counter 230. In one embodiment, exclusive OR gate 220 outputs an error pulse signal when its two input signals do not match. In other words, the error pulse signal sent from exclusive OR gate 220 to error counter 230 has a high binary value (i.e., is a 1 bit) when the two input signals of exclusive OR gate 220 are not equal and has a low binary value (i.e., is a 0 bit) otherwise. Also, in one embodiment, the pulse width of the error pulse signal represents the number of error bits.

Error counter 230 counts (i.e., accumulates) the error pulse signals and provides the result of the counting as a bit error count to the IC core. In one embodiment, the bit error count output by error counter 230 is a 6 bit wide signal. In another embodiment, the bit error count output by error counter 230 is an 8 bit wide signal. In one embodiment, the bit error count reports the number of bit errors for every 256 or 64 bits compared.

As noted above, in one embodiment, BER checker 170 is a dedicated BER checker. It is to be noted that, even in an embodiment where BER checker 170 is a dedicated BER checker, programmable delay circuit 210 would still remain programmable in the sense that its delay is variable.

Figure 3:
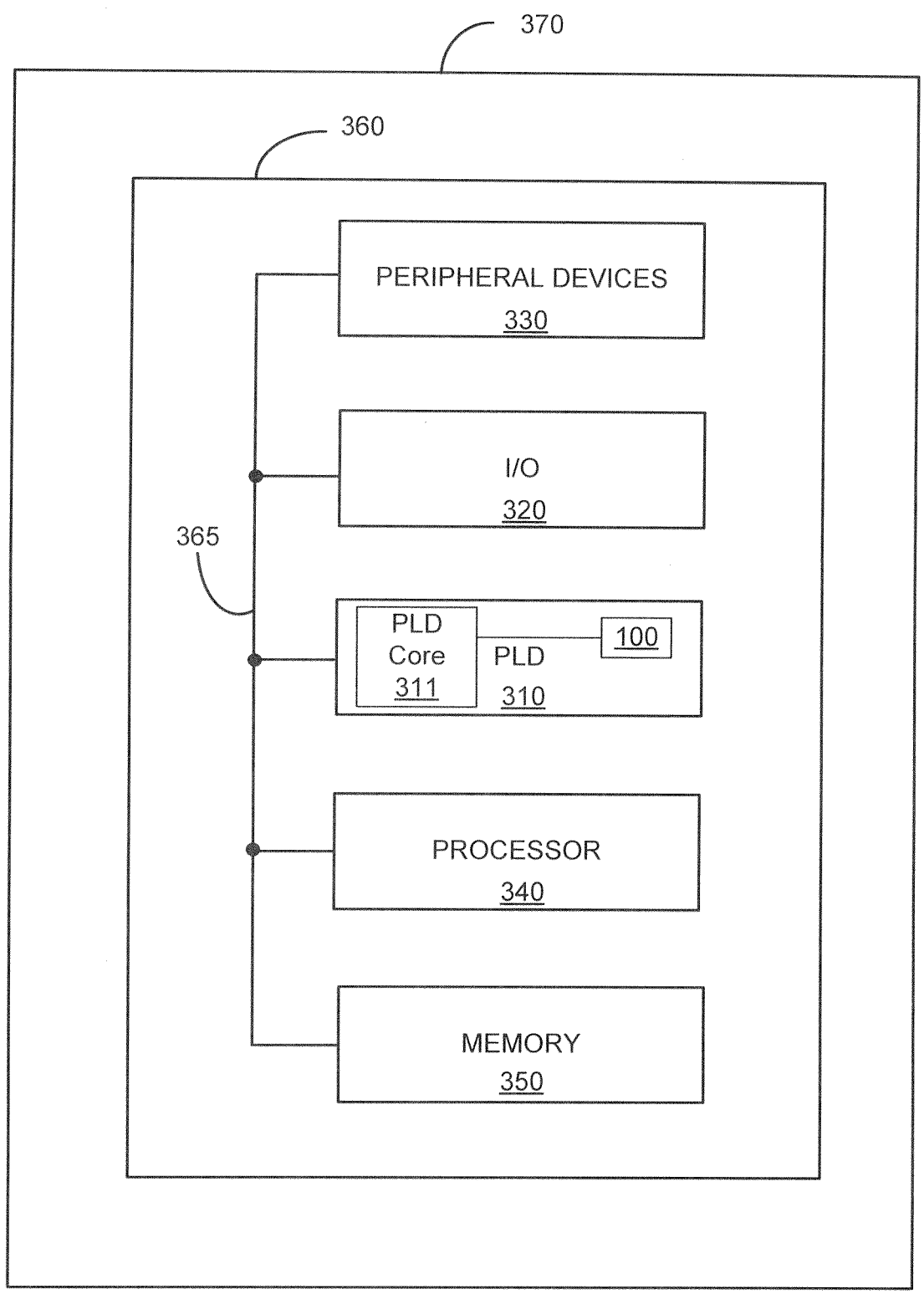
FIG. 3 illustrates an exemplary data processing system including an exemplary IC which includes an embodiment of the receiver circuitry and BER checker of the present invention.

FIG. 3 illustrates an exemplary data processing system including an exemplary IC (e.g., a PLD) which includes an embodiment of the RX circuitry and BER checker of the present invention.

Circuits including an embodiment of the RX circuitry and BER checker of the present invention might be included in a variety of ICs, including ICs that are PLDs. PLDs (also sometimes referred to as complex PLDs (CPLDs), programmable array logic (PALs), programmable logic arrays (PLAs), field PLAs (FPLAs), erasable PLDs (EPLDs), electrically erasable PLDs (EEPLDs), logic cell arrays (LCAs), field programmable gate arrays (FPGAs), or by other names) provide the advantages of fixed ICs with the flexibility of custom ICs. Such devices typically provide an "off the shelf" device having at least a portion that can be programmed to meet a user's specific needs. Application specific integrated circuits (ASICs) have traditionally been fixed ICs. However, it is possible to provide an ASIC that has a portion or portions that are programmable. Thus, it is possible for an IC device to have qualities of both an ASIC and a PLD. The term PLD as used herein will be considered broad enough to include such devices.

PLDs have configuration elements that may be programmed or reprogrammed. Configuration elements may be realized as random access memory (RAM) bits, flip-flops, electronically erasable programmable read-only memory (EEPROM) cells, or other memory elements. Placing new data into the configuration elements programs or reprograms the PLD's logic functions and associated routing pathways. Configuration elements that are field programmable are often implemented as RAM cells (sometimes referred to a "configuration RAM" (CRAM)). However, many types of configurable elements may be used including static or dynamic RAM (SRAM or DRAM), electrically erasable read-only memory (EEROM), flash, fuse, and anti-fuse programmable connections. The programming of configuration elements could also be implemented through mask programming during fabrication of the device. While mask programming may have disadvantages relative to some of the field programmable options already listed, it may be useful in certain high volume applications. For purposes herein, the generic term "configuration element" will be used to refer to any programmable element that may be configured to determine functions implemented by other PLD elements.

FIG. 3 illustrates, by way of example, PLD 310 in data processing system 300. As one example, an embodiment of this invention (e.g., RX circuitry and BER checker 100) may be implemented in PLDs, such as PLD 310. In one embodiment, RX circuitry and BER checker 100 is on the same die/chip as PLD 310. In other words, RX circuitry and BER checker 100 is integrated with PLD 310. In one embodiment, the logic and protocols for RX circuitry and BER checker 100 are supported by PLD core 311 (which is programmable) of PLD 310. As shown in FIG. 3, RX circuitry and BER checker 100 is coupled to PLD core 311. It is to be noted that RX circuitry and BER checker 100 can be used to do BER checking in the field (i.e., while PLD 310 is installed in system 300) without the use of probes and oscilloscopes in field. Data processing system 300 may include one or more of the following components: processor 340, memory 350, input/output (I/O) circuitry 320, and peripheral devices 330. These components are coupled together by system bus 365 and are populated on circuit board 360 which is contained in end-user system 370. A data processing system such as system 300 may include a single end-user system such as end-user system 370 or may include a plurality of systems working together as a data processing system.

System 300 can be used in a wide variety of applications, such as computer networking, data networking, instrumentation, video processing, digital signal processing (DSP), or any other application where the advantage of using programmable or reprogrammable logic is desirable. PLD 310 can be used to perform a variety of different logic functions. For example, PLD 310 can be configured as a processor or controller that works in cooperation with processor 340 (or, in alternative embodiments, a PLD might itself act as the sole system processor). PLD 310 may also be used as an arbiter for arbitrating access to a shared resource in system 300. In yet another example, PLD 310 can be configured as an interface between processor 340 and one of the other components in system 300. It should be noted that system 300 is only exemplary.

In one embodiment, system 300 is a digital system. As used herein a digital system is not intended to be limited to a purely digital system, but also encompasses hybrid systems that include both digital and analog subsystems.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. An integrated circuit (IC) comprising:
   an eye viewer; and
   a bit error rate (BER) checker coupled to the eye viewer, wherein the BER checker receives a serial data signal from the eye viewer.

2. The IC of claim 1, wherein the BER checker receives the serial data signal from the eye viewer without the serial data signal passing through a deserializer.

3. The IC of claim 1, wherein the BER checker compares the serial data signal against a reference data signal to determine a BER for the serial data signal.

4. The IC of claim 1 further comprising:
   an IC core coupled to the eye viewer and the BER checker; wherein the BER checker is outside the IC core.

5. The IC of claim 4, wherein the BER checker is a dedicated BER checker.

6. The IC of claim 1, wherein the BER checker comprises:
   an exclusive OR gate.

7. The IC of claim 6, wherein the BER checker further comprises:
   a programmable delay circuit coupled to the exclusive OR gate; and
   an error counter coupled to the exclusive OR gate.

8. The IC of claim 7 further comprising:
   a clock data recovery (CDR) circuitry coupled to the eye viewer;
   a first multiplexer coupled to the CDR circuitry and the eye viewer;
   a deserializer coupled to the first multiplexer; and
   a second multiplexer coupled to the CDR circuitry and the BER checker;
   wherein the first multiplexer receives a first data signal from the CDR circuitry and a second data signal from the eye viewer, selects one of the first data signal and the second data signal, and provides a first selected data signal to the deserializer;
   further wherein the second multiplexer receives the first data signal from the CDR circuitry and a known data signal, selects one of the first data signal and the known data signal, and provides a second selected data signal to the BER checker; and
   further wherein the BER checker receives the second selected data signal and the second data signal, and the programmable delay circuit matches delays of the second selected data signal and the second data signal, wherein the second data signal is the serial data signal.

9. The IC of claim 1, wherein the IC is a programmable logic device.

10. A digital system comprising the IC of claim 1.

11. An integrated circuit (IC) comprising:
    a clock data recovery (CDR) circuitry;
    an eye viewer coupled to the CDR circuitry;
    a deserializer coupled to the CDR circuitry and the eye viewer;
    an IC core coupled to the deserializer; and
    a bit error rate (BER) checker coupled to the eye viewer, the CDR circuitry, and the IC core, wherein the BER checker comprises:
       a comparator;
       a programmable delay circuit coupled to the comparator; and
       an error counter coupled to the comparator;
    wherein the BER checker is outside the IC core.

12. The IC of claim 11, wherein the comparator comprises an exclusive OR gate.

13. The IC of claim 12, wherein the BER checker receives a serial data signal from the eye viewer without the serial data signal passing through the deserializer.

14. The IC of claim 13 further comprising:
    a first multiplexer, wherein a first input terminal of the first multiplexer is coupled to the CDR circuitry, a second input terminal of the first multiplexer is coupled to the eye viewer, and an output terminal of the first multiplexer is coupled to the deserializer, further wherein the first multiplexer receives a first data signal from the CDR circuitry and a second data signal from the eye viewer, selects one of the first data signal and the second data signal, and provides a first selected data signal to the deserializer; and
    a second multiplexer, wherein a first input terminal of the second multiplexer is coupled to the CDR circuitry, a second input terminal of the second multiplexer is coupled to a known data signal, and an output terminal of the second multiplexer is coupled to the programmable delay circuit, further wherein the second multiplexer receives the first data signal from the CDR circuitry and the known data signal, selects one of the first data signal and the known data signal, and provides a second selected data signal to the BER checker;
    further wherein the BER checker receives the second selected data signal and the second data signal, wherein the programmable delay circuit matches delays of the second selected data signal and the second data signal, wherein the second data signal is the serial data signal.

15. The IC of claim 11, wherein the IC is a programmable logic device.

16. A digital system comprising the IC of claim 11.

17. A method of bit error rate (BER) checking, the method comprising:
    sampling a data signal to provide a sampled serial data signal;
    selecting between a recovered serial data signal and a known data signal to provide a selected reference serial data signal;
    receiving the sampled serial data signal and the selected reference serial data signal; and
    comparing the sampled serial data signal and the selected reference serial data signal to provide a BER of the sampled serial data signal;
    wherein the sampling, selecting, receiving, and comparing are performed in an integrated circuit (IC).

18. The method of claim 17, wherein the receiving the sampled serial data signal occurs without the sampled serial data signal passing through a deserializer.

19. The method of claim 18 further comprising:
    aligning the sampled serial data signal with the selected reference serial data signal prior to the comparing.

20. The method of claim 19, wherein the comparing includes performing an exclusive OR operation on the sampled serial data signal and the selected reference serial data signal.

* * * * *